United States Patent
Tak

(10) Patent No.: US 7,612,864 B2
(45) Date of Patent: Nov. 3, 2009

(54) EXPOSURE APPARATUS AND METHOD

(75) Inventor: Young-Mi Tak, Seoul (KR)

(73) Assignee: Samsung Electronics Co., Ltd. (KR)

( * ) Notice: Subject to any disclaimer, the term of this patent is extended or adjusted under 35 U.S.C. 154(b) by 784 days.

(21) Appl. No.: 11/072,075

(22) Filed: Mar. 4, 2005

(65) Prior Publication Data

US 2005/0200822 A1    Sep. 15, 2005

(30) Foreign Application Priority Data

Mar. 13, 2004  (KR) .................. 10-2004-0017178

(51) Int. Cl.
*G03B 27/54* (2006.01)

(52) U.S. Cl. .................. 355/67; 430/311; 430/396

(58) Field of Classification Search ................ None
See application file for complete search history.

(56) References Cited

U.S. PATENT DOCUMENTS

RE38,176 E  *  7/2003  Wakamoto et al. ............ 355/53

* cited by examiner

*Primary Examiner*—John A McPherson
*Assistant Examiner*—Daborah Chacko Davis
(74) *Attorney, Agent, or Firm*—Cantor Colburn LLP

(57) ABSTRACT

An exposure apparatus includes an optical system generating light, a mask, a light-absorbing member and a substrate plate. The mask includes a mask body disposed at a path of the light, a first light transmission pattern formed in a first region of the mask body, and a second light transmission pattern formed in a second region of the mask body. The mask is transported in a first direction. The light-absorbing member is disposed between the optical system and the mask, and has a diffusive reflection preventing part formed at a side surface of the light-absorbing member. The substrate plate supports a substrate having a photoresist layer formed thereon. The substrate plate is transported along the first direction together with the mask, thereby preventing a diffusive reflection.

20 Claims, 8 Drawing Sheets

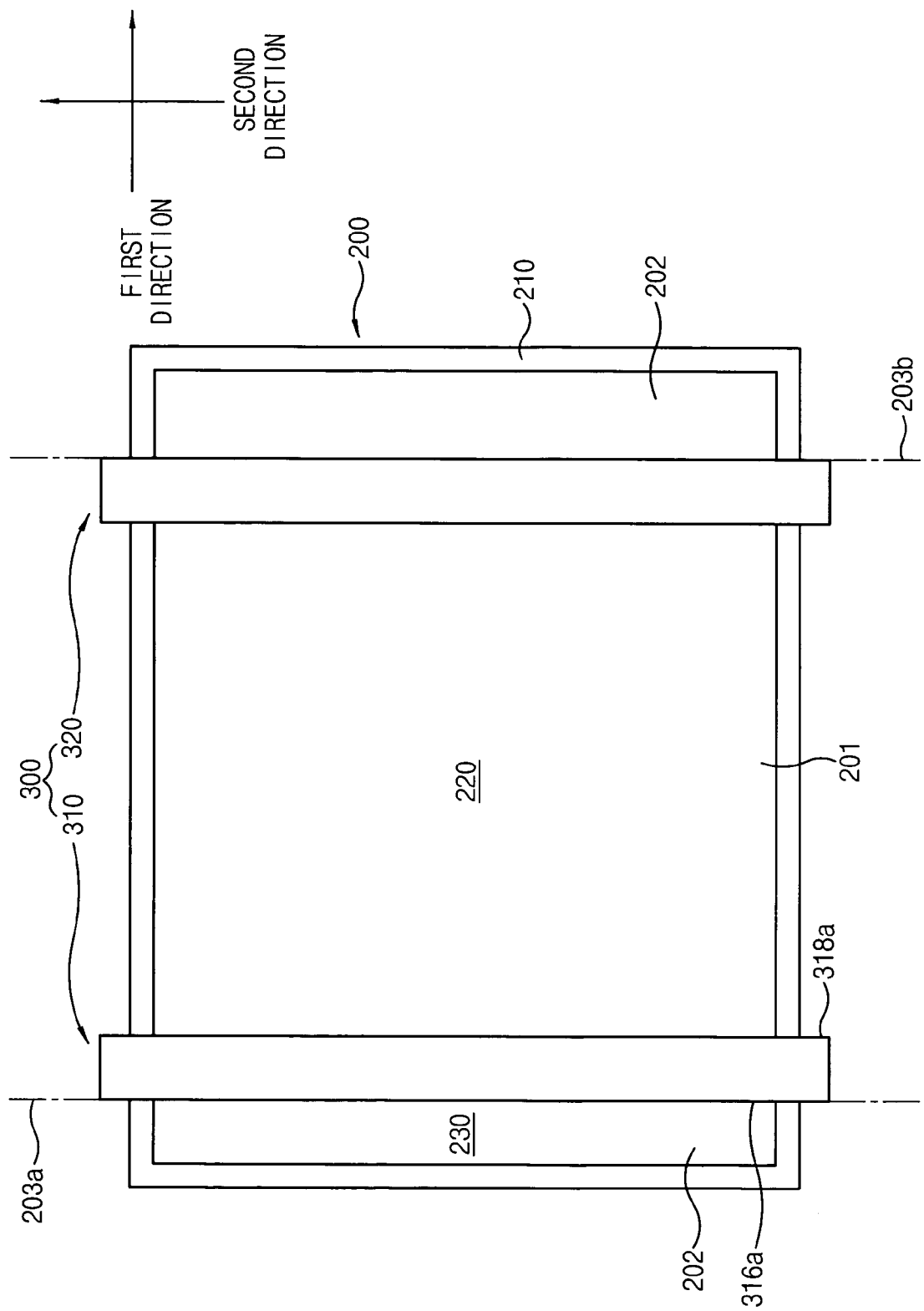

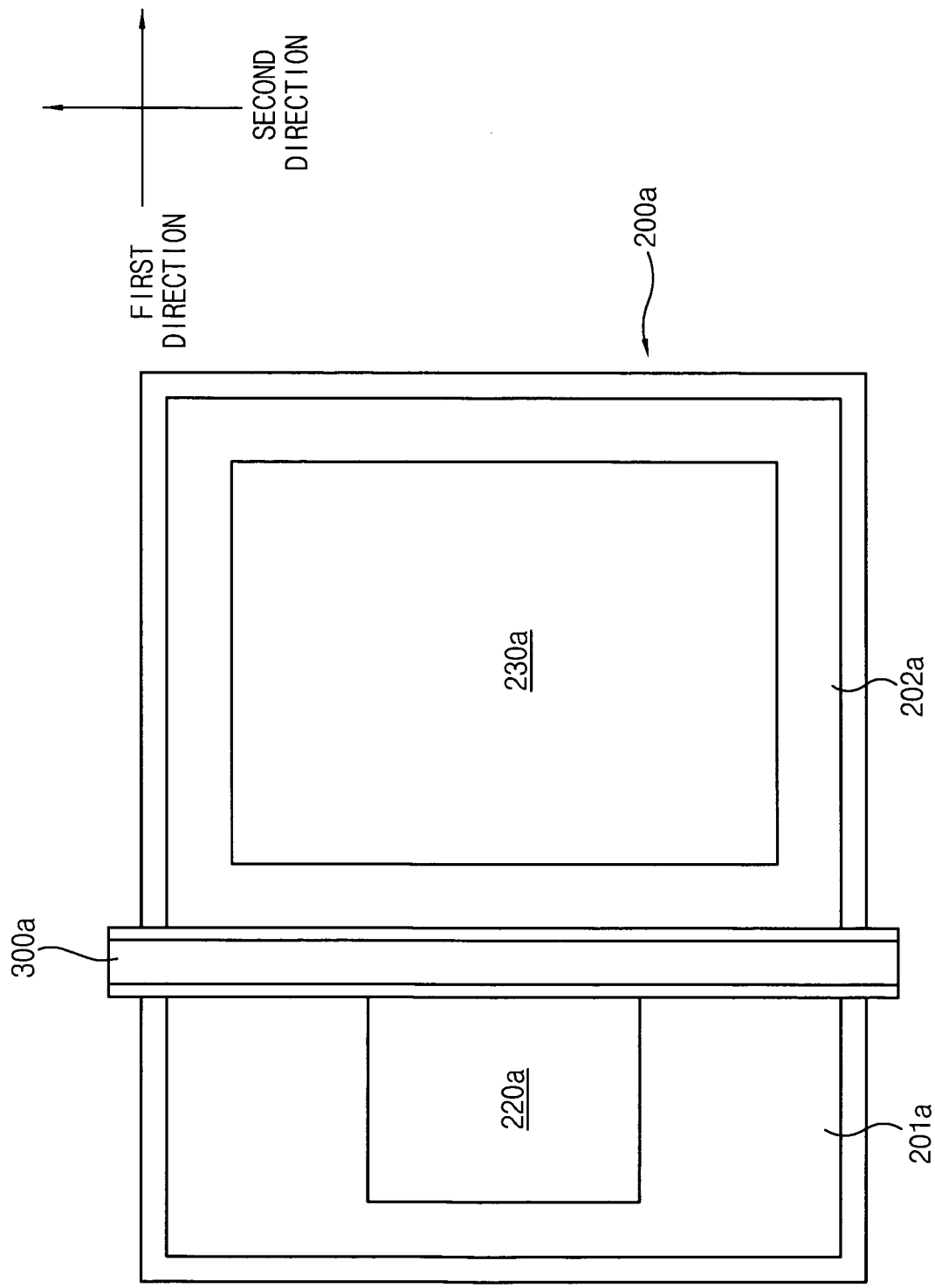

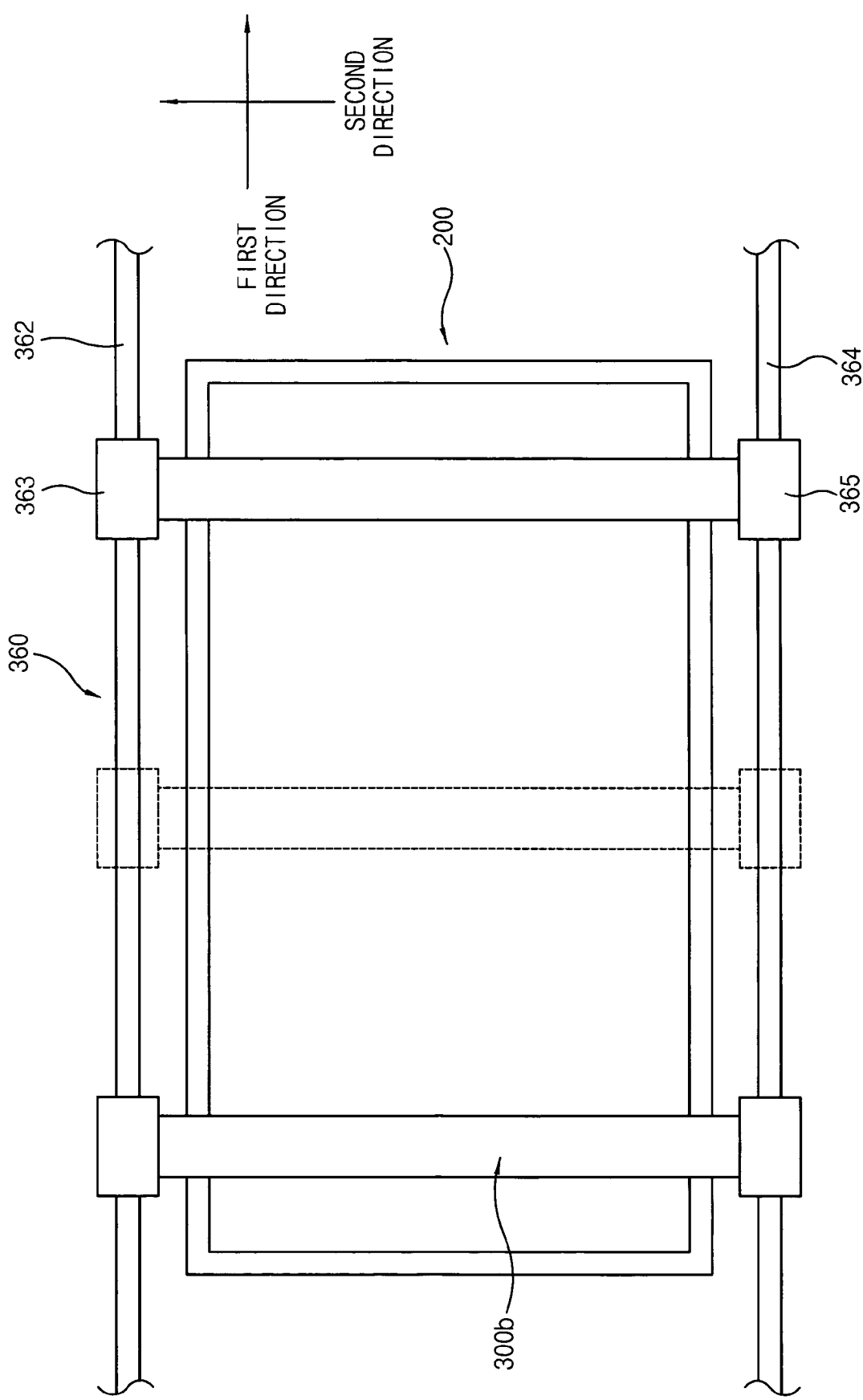

EXPOSURE APPARATUS AND METHOD

BACKGROUND OF THE INVENTION

1. Field of the Invention

The present invention relates to an exposure apparatus and a method of exposing a photoresist layer. More particularly, the present invention relates to an exposure apparatus enhancing quality of photoresist patterns when used as an etch mask, and a method of exposing a photoresist layer.

2. Description of the Related Art

Generally, an information processing apparatus requires a display apparatus that transforms an electrical signal processed by the information processing apparatus into an image. Examples of the display apparatus include a liquid crystal display (LCD) apparatus, a light emitting display (LED) apparatus, a plasma display panel (PDP), etc. Such display apparatuses include thin film transistors (TFTs) formed on a substrate. A TFT includes a gate electrode, a channel layer, a source electrode and a drain electrode. The gate, source and drain electrodes are formed by patterning a metal layer. The channel layer is formed by patterning a semiconductor layer such as an amorphous silicon layer. The gate, source and drain electrodes, and the channel layer may be patterned, for example, through a photolithography process.

The photolithography process includes a photoresist film coating process, an exposure process, a developing process and an etching process. The exposure process is performed by an exposure apparatus.

The exposure apparatus is classified as either a scan type or a stepper type. The scan type exposure apparatus includes an optical system, a mask and a substrate plate that supports the substrate. The mask is disposed over the substrate plate, and the optical system is disposed over the mask. Light generated from the optical system is irradiated onto the substrate on the substrate plate through the mask. The substrate on the substrate plate and the mask are transported together, and the optical system may irradiate light onto a local portion of the substrate through the mask. The mask includes patterns and an alignment key for aligning the mask on the substrate.

The scan type exposure apparatus also includes a mask blind disposed over or under the mask. The mask blind prevents light interference between the alignment key and the patterns. The mask blind blocks the patterns when light generated from the optical system is irradiated onto the alignment key. The mask blind also blocks the alignment key when light generated by the optical system is irradiated onto the patterns.

A conventional scan type exposure apparatus reflects light diffusively at an edge portion of the mask blind, which induces exposure defects and generates particles. Thus, it is desired to produce an exposure apparatus that overcomes the above mentioned defects.

SUMMARY OF THE INVENTION

The present invention provides an exposure apparatus capable of reducing exposure defects. The present invention also provides an exposure method capable of reducing exposure defects.

In an exemplary exposure apparatus according to the present invention, the exposure apparatus includes an optical system, a mask, a light-absorbing member and a substrate plate. The optical system generates light. The mask includes a mask body disposed at a path of the light, a first light transmission pattern formed in a first region of the mask body, and a second light transmission pattern formed in a second region of the mask body. The first and second regions are adjacent to each other. The mask is transported in a first direction. The light-absorbing member is disposed between the optical system and the mask, and has a diffusive reflection preventing part formed at a side surface of the light-absorbing member. The substrate plate supports a substrate having a photoresist layer formed thereon. The substrate plate is transported along the first direction together with the mask.

In another exemplary exposure apparatus according to the present invention, the exposure apparatus includes an optical system, a mask, a light-absorbing member and a substrate plate. The optical system generates light. The mask includes a mask body disposed at a path of the light, a first light transmission pattern formed in a first region of the mask body, and a second light transmission pattern formed in a second region of the mask body. The first and second regions are adjacent to each other. The mask is transported in a first direction. The light-absorbing member is disposed between the optical system and the mask, and has a diffusive reflection-preventing member attached to a side surface of the light-absorbing member. The substrate plate supports a substrate having a photoresist layer formed thereon. The substrate plate is transported along the first direction together with the mask.

In an exemplary method of exposing a photoresist layer formed on a substrate by a mask having a first light transmission pattern formed in a first region of the mask and a second light transmission pattern formed in a second region of the mask, a light-absorbing member is arranged in the second region to cover a portion of the second region such that a first diffusive reflection preventing part disposed at a first side surface of the light-absorbing member is disposed at a border between the first and second regions. A light is irradiated onto the first region through the first light transmission pattern. The light-absorbing member is arranged in the first region to cover a portion of the first region such that a second diffusive reflection preventing part disposed at a second side surface of the light-absorbing member is disposed at the border between the first and second regions. Then, light is irradiated onto the second region through the second light transmission pattern, thereby preventing a diffusive reflection caused by the side surface of the light-absorbing member to reduce exposure defects.

In another exemplary embodiment, the method above further includes disposing smooth surfaces at the first and second diffusive reflection preventing parts to prevent a diffusive reflection of light.

In another exemplary embodiment, the method above further includes transporting the mask and the substrate in a same direction.

In yet another exemplary embodiment, arranging the light-absorbing member includes disposing a first light-absorbing sub-member and a second light-absorbing sub-member spaced apart from each other.

This application relies for priority upon Korean Patent Application No. 2004-17178 filed on Mar. 13, 2004, the contents of which are herein incorporated by reference in its entirety.

BRIEF DESCRIPTION OF THE DRAWINGS

The above and other features and advantages of the present invention will become more apparent by describing in detailed exemplary embodiments thereof with reference to the accompanying drawings, in which:

FIG. 3 is a plan view illustrating a mask and a light-absorbing member in FIG. 1;

FIG. 4 is a plan view illustrating the mask and the light-absorbing member according to another exemplary embodiment in FIG. 1;

FIG. 7 is a plan view illustrating a mask and a light-absorbing member according to another exemplary embodiment of the present invention.

DESCRIPTION OF EMBODIMENTS

Hereinafter, the embodiments of the present invention will be described in detail with reference to the accompanied drawings.

Exposure Apparatus

Figure 1:
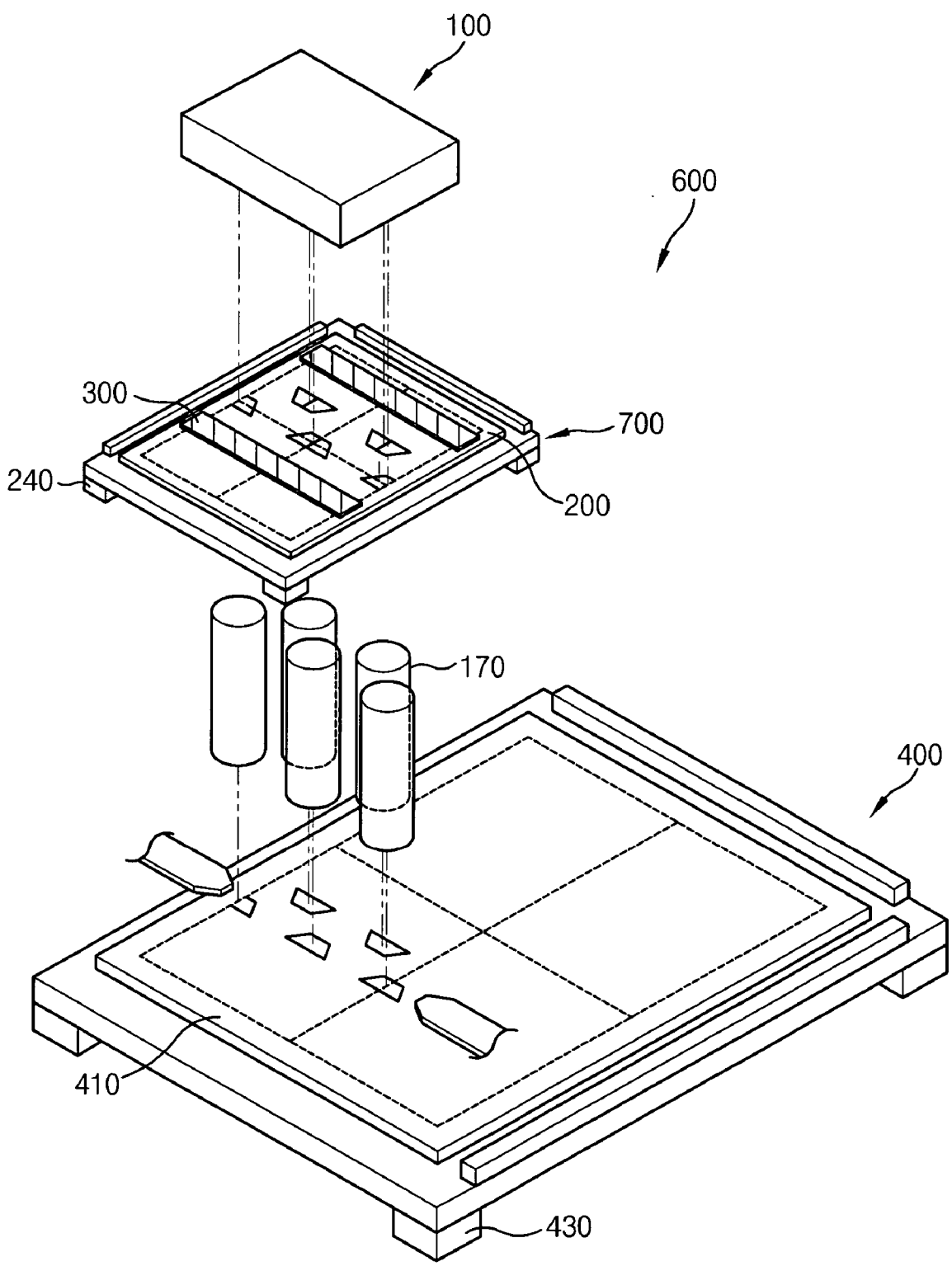
FIG. 1 is a perspective view illustrating an exposure apparatus according to an exemplary embodiment of the present invention.
Figure 2:
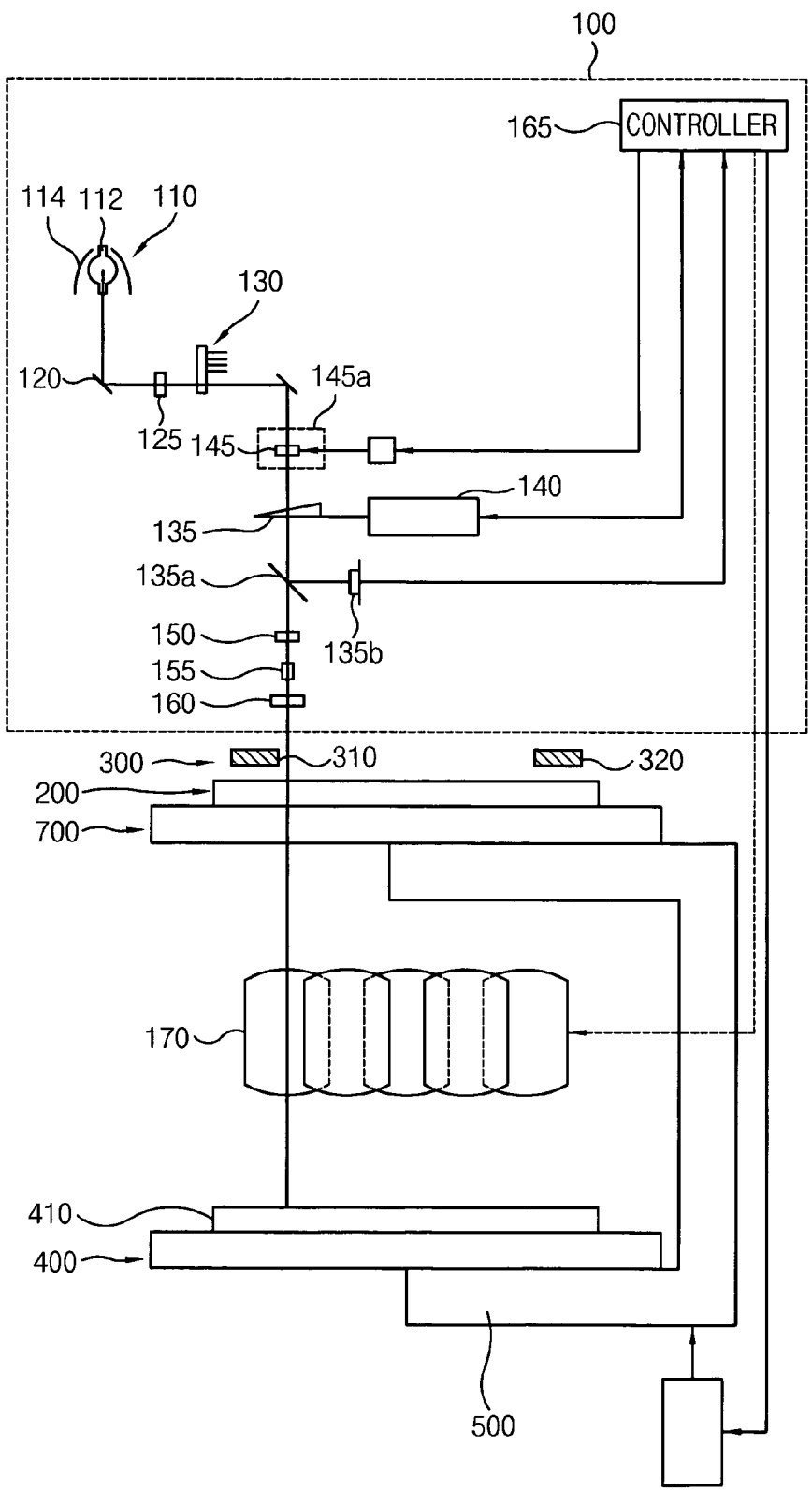
FIG. 2 is a schematic view illustrating the exposure apparatus in FIG. 1.

FIG. 1 is a perspective view illustrating an exposure apparatus according to an exemplary embodiment of the present invention, and FIG. 2 is a schematic view illustrating the exposure apparatus in FIG. 1.

Referring to FIG. 1, an exposure apparatus 600 includes an optical system 100, a mask 200, a light-absorbing member 300 and a substrate plate 400. Referring to FIG. 2, the optical system 100 that generates light advancing toward the mask 200 and the substrate plate 400 includes a light source 110. The light source 110 includes a lamp 112 that generates light and a light-condensing mirror 114 that condenses the light generated by the lamp 112. For example, a cross-section of the light-condensing mirror 114 may have a quadratic curve. The light condensed by the light-condensing mirror 114 is reflected by a light-reflecting mirror 120 and advances toward a filter 125. The filter 125 allows light having a specific wavelength that is adequate for exposure to pass through the filter 125.

The light that passes through the filter 125 enters a light splitter 130 which divides the light into multiple branches of light (hereinafter, called "branch lights"), for example, five to seven branch lights. Optical paths of the branch lights are different from each other. In FIG. 2, one branch light is illustrated for convenience. The branch light advances toward an intensity control filter 135 that controls intensity of the branch light. A driving module 140 drives the intensity control filter 135.

A shutter 145 is disposed on the path of the branch light, for example, between the light splitter 130 and the intensity control filter 135. The shutter 145 disposed in a shutter region 145a transmits or blocks the branch light.

The branch light that exits the intensity control filter 135 passes through a relay lens 150, a fly eye lens 155 and a condensing lens 160 in a sequence by that named order. The fly eye lens 155 controls intensity of illumination.

A half mirror 135a is disposed, for example, between the intensity control filter 135 and the lenses. The half mirror 135a samples a portion of the branch light for a monitoring purpose. A detector 135b detects the portion of the branch light sampled by the half mirror 135a. A controller 165 controls the driving module 140 and the detector 135b. The branch lights from the optical system 100 each have, for example, a trapezoidal cross-sectional shape. The branch lights advance toward the mask 200. The branch lights are arranged in a zigzag pattern such that oblique sides of diagonally adjacent trapezoidal shapes face each other.

The exposure apparatus 600 further includes a projection module 170 that may be disposed between the mask 200 and the substrate plate 400. The projection module 170 adjusts a position of the branch light that passes through the mask 200.

Referring to FIGS. 1 and 2, the mask 200 has substantially same shape as that of a substrate 410 disposed on the substrate plate 400. For example, when the substrate 410 has a rectangular shape, the mask 200 has also the rectangular shape. Additionally, the mask 200 is supported by a mask supporter 700 having a mask-leveling unit (or a first leveling unit) 240 that adjusts the mask 200 such that the mask 200 is substantially parallel with the substrate plate 400. The substrate plate 400 is disposed on an optical path that passes through the mask 200. The substrate 410 is disposed on the substrate plate 400. The substrate 410 includes a photoresist layer formed thereon. The substrate plate 400 includes a substrate-leveling unit (or second leveling unit) 430.

Both the mask supporter 700 and the substrate plate 400 are combined with a carrier 500, so that both of the mask supporter 700 and the substrate plate 400 may be transported together via the carrier 500. Light generated by the optical system 100 passes through the mask 200 and is irradiated onto the photoresist layer formed on the substrate 410, thereby exposing the photoresist layer.

FIG. 3 is a plan view illustrating the mask 200 and the light-absorbing member 300 in FIG. 1. The mask 200 includes a mask body 210, a first light transmission pattern 220 and a second light transmission pattern 230. The mask body 210 includes a first region 201 and a second region 202. The first and second regions 201 and 202 are arranged along a first direction as shown in FIG. 3. In an exemplary embodiment, the first region 201 may be disposed between two second regions 202.

The first and second light transmission patterns 220 and 230 are disposed in the first and second regions 201 and 202, respectively. The first light transmission pattern 220 corresponds to an active pattern for forming image displaying elements of an apparatus, for example a TFT, a pixel electrode, a black matrix, a color filter pattern, etc. The second light transmission pattern 230 corresponds to an arrangement pattern that is to be used in a subsequent procedure, for arranging masks. In an exemplary embodiment, the second light transmission pattern 230 corresponds to one of a key pattern for forming the TFT, a key pattern for forming the pixel electrode, a key pattern for forming the black matrix, a key pattern for forming the color filter pattern, etc. The first light transmission pattern 220 has a first area, and the second light transmission pattern 230 has a second area that may be equal to or smaller than the first area. For example, the first area is greater than the second area.

FIG. 4 is a plan view illustrating a mask 200a and a light-absorbing member 300a according to another exemplary embodiment.

Referring to FIG. 4, a first light transmission pattern 220a formed in a first region 201a corresponds to an active pattern for forming elements of an apparatus, for example a TFT, a pixel electrode, a black matrix, a color filter pattern, etc. A second light transmission pattern 230a formed in a second region 202a also corresponds to an active pattern for forming image displaying elements of the apparatus, for example a TFT, a pixel electrode, a black matrix, a color filter pattern, etc. The first light transmission pattern 220a has a first area, and the second light transmission pattern 230a has a second area that may be equal to or larger than the first area. For example, the first area is smaller than the second area.

Figure 5A:
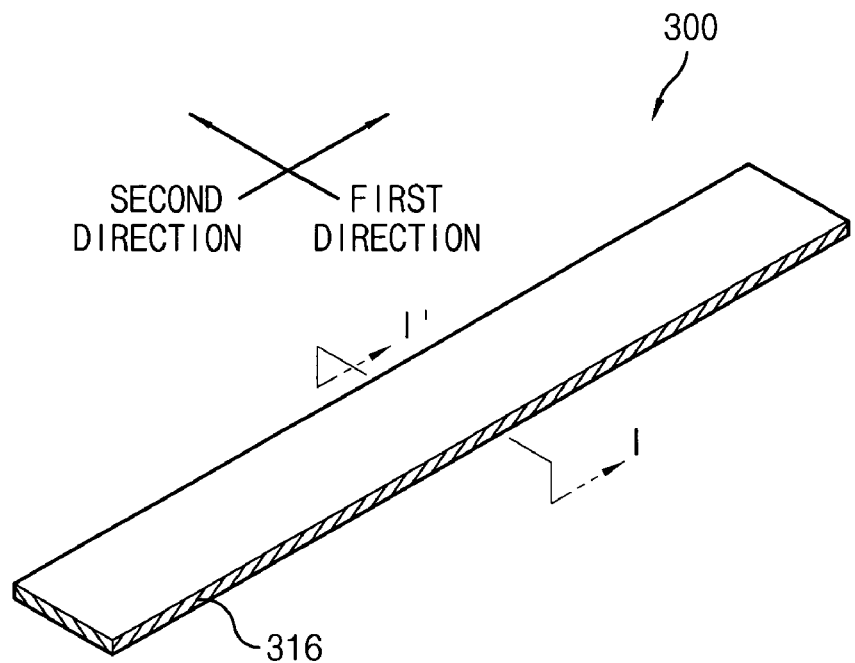
FIG. 5A is a perspective view illustrating the light-absorbing member in FIG. 3.
Figure 5B:
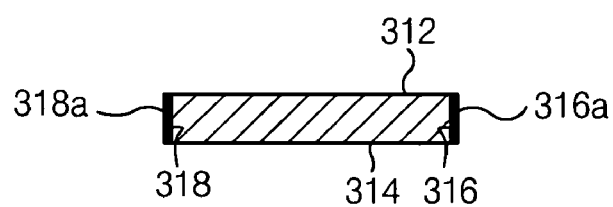
FIG. 5B is a cross-sectional view taken along a line I-I' in FIG. 5A.

FIG. 5A is a perspective view illustrating the light-absorbing member 300 in FIG. 3, and FIG. 5B is a cross-sectional view taken along a line I-I' in FIG. 5A.

Referring to FIGS. 3, 5A and 5B, the light-absorbing member 300 is interposed between the optical system 100 and the mask 200. The light-absorbing member 300 is disposed along borders 203a and 203b between the first and second regions 201 and 202. The light-absorbing member 300 is extended along a second direction that is substantially perpendicular to the first direction.

When there is one second region 202a, as shown in FIG. 4, for example, one border is defined between the first and second regions 201a and 202a and one light-absorbing member 300a is disposed along the border.

When there are two second regions 202, as shown in FIG. 3, for example, two borders 203a and 203b are defined between the first region 201 and the two second regions 202. Therefore, when there are two second regions 202, the light-absorbing member 300 includes a first light-absorbing sub-member 310 and a second light-absorbing sub-member 320. The first and second light-absorbing sub-members 310 and 320 are disposed along the two borders 203a and 203b, respectively.

The light-absorbing member 300 has a rectangular parallelepiped shape having a thin thickness. The light-absorbing member 300 includes a first face 312 and a second face 314. First and second faces 312 and 314 face each other and are substantially parallel to each other. First and second faces 312 and 314 form top and bottom sides, respectively, of the light-absorbing member 300 with respect to the first and second regions 201 and 202. The light-absorbing member 300 also includes four side-faces connecting the first and second faces 312 and 314. The four side-faces are each disposed substantially perpendicular to the first and second faces 312 and 314. The four side faces include a first side face 316 and a second side face 318. First and second faces 312 and 314 and first and second side faces 316 and 318 are each extended along the second direction. The light-absorbing member 300 may include chromium (Cr) or chromium oxide ($CrO_2$). In this exemplary embodiment, the light-absorbing member 300 has a width of about 66 mm.

The first side face 316 or the second side face 318 may be disposed along the border 203a or 203b of the first and second regions 201 and 202. The first and second side faces 316 and 318 absorb a portion of light advancing toward the first or second region 201 or 202. However, a remaining portion of the light is diffusively reflected by the first or second side face 316 or 318, which may induce exposure defects.

According to the present embodiment, in order to prevent a diffusive reflection from occurring on the first or second side face 316 or 318, a first diffusive reflection preventing part 316a and a second diffusive reflection preventing part 318a are disposed at the first and second side faces 316 and 318, respectively. The first and second diffusive reflection preventing parts 316a and 318a correspond to surface-treated first and second side faces 316 and 318, respectively. For example, the first and second diffusive reflection preventing parts 316a and 318a may be integrally formed with the light-absorbing member 300, or attached on the first and second side faces 316 and 318, respectively, in a attachable/detachable manner.

Figure 6A:
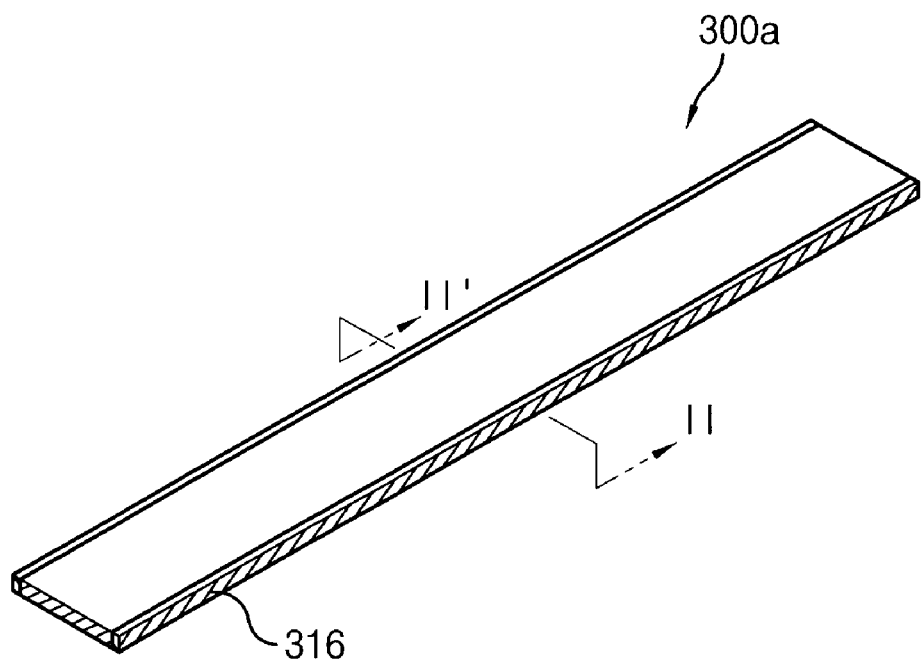
FIG. 6A is a perspective view illustrating the light-absorbing member in FIG. 4.
Figure 6B:
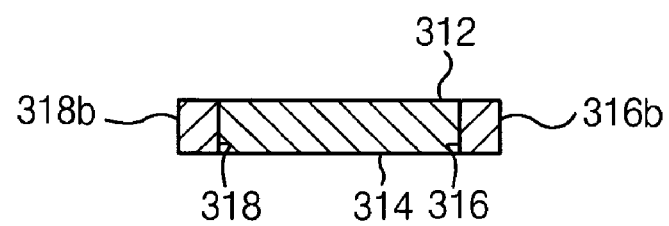
FIG. 6B is a cross-sectional view taken along a line II-II' in FIG. 6A.

FIG. 6A is a perspective view illustrating the light-absorbing member 300 in FIG. 4, and FIG. 6B is a cross-sectional view taken along a line II-II' in FIG. 6A.

Referring to FIGS. 4, 6A and 6B, a first diffusive reflection preventing member 316b and a second diffusive reflection preventing member 318b are disposed at the first and second side faces 316 and 318, respectively. The first and second diffusive reflection preventing members 316b and 318b prevent diffusive reflection. In an alternative embodiment, the first and second diffusive reflection preventing members 316b and 318b may have a smooth surface that prevents a diffusive reflection. In another embodiment, the first and second diffusive reflection preventing members 316b and 318b may include a material for absorbing light.

FIG. 7 is a plan view illustrating the mask 200 and the light-absorbing member 300b according to another exemplary embodiment of the present invention.

Referring to FIG. 7, an exposure apparatus according to the present embodiment may further include an interval adjusting part 360 that adjusts a distance between light-absorbing sub-members of the light-absorbing member 300b.

The interval adjusting part 360 includes a first guide rail 362, a first transferring unit 363, a second guide rail 364 and a second transferring unit 365. The first and second guide rails 362 and 364 are disposed substantially parallel to each other. The mask 200 is disposed between the first and second guide rails 362 and 364.

A number of the first transferring unit 363 and a number of the second transferring unit 365 are each equal to a number of the light-absorbing sub-members of the light-absorbing member 300b. Thus, for example, when two light-absorbing sub-members are used, two first transferring units 363 are disposed along the first guide rail 362 and two second transferring units 365 are disposed along the second guide rail 364. The first and second transferring units 363 and 365 grip the light-absorbing sub-members of the light-absorbing member 300.

Exposure Method

Hereinafter, an exposure method will be explained. Although the exposure method described below refers to only one border between the first and second regions 201 and 202, it will be appreciated by one skilled in the art, that the method described below could also be employed for each of two borders between the first and second regions 201 and 202. Same reference numerals will be used to refer to the same parts as those described in FIG. 1.

Figure 8:
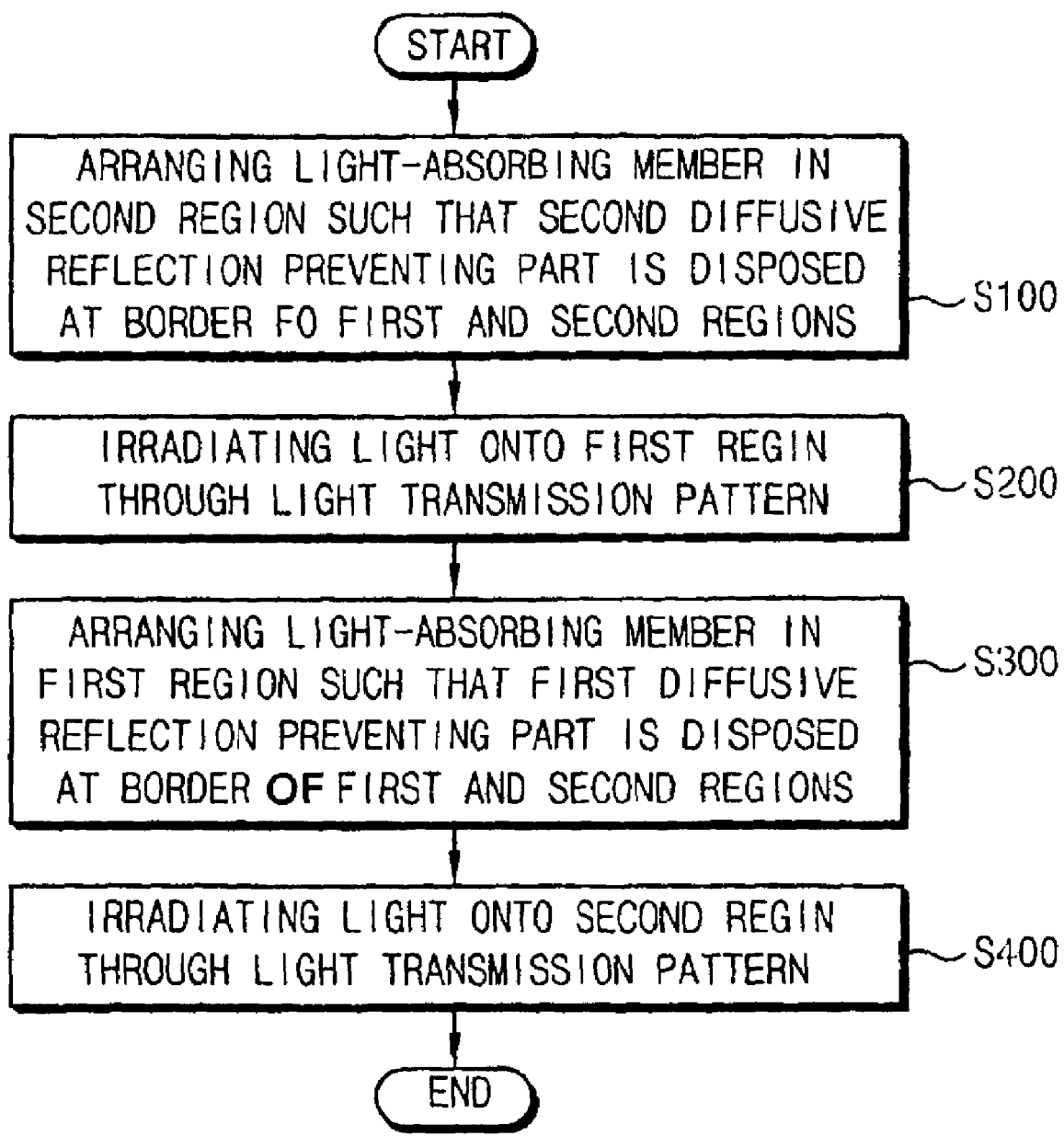
FIG. 8 is a flow chart illustrating an exposure method according to an exemplary embodiment of the present invention.

FIG. 8 is a flow chart illustrating an exposure method according to an exemplary embodiment of the present invention.

Referring to FIGS. 1 to 3, and 8, a substrate having a photoresist layer formed thereon is loaded on the substrate plate 400. The substrate-leveling unit 430 adjusts a level of the substrate 410. During leveling the substrate 410, the mask-leveling unit 240 adjusts a level of the mask 200.

The light-absorbing member 300 is disposed on the mask 200, such that the light-absorbing member 300 covers a portion of the second region 202 and the second diffusive reflection preventing part 318a is disposed at the border of the first and second regions 201 and 202 (step S100). The light-absorbing member 300 covers a portion of the second region 202 and the second diffusive reflection preventing part 318a prevents a diffusive reflection of light that is to be irradiated onto the photoresist layer.

The lamp 112 of the optical system 100 then generates light, which is adjusted to be appropriate for exposure, and irradiated onto the mask 200 (step S200). The substrate plate 400 and the mask supporter 700 are transported by the carrier 500 so that the mask 200 is scanned.

Light passes through the first light transmission pattern 220 to arrive at the first region 201. The light also arrives at the border of the first and second regions 201 and 202. However, the second diffusive reflection preventing part 318a prevents diffusive reflection. The photoresist layer formed on the substrate 410 is exposed to form patterns for forming image displaying elements of an apparatus, for example a TFT, a pixel electrode, a black matrix, a color filter pattern, etc.

When exposing the photoresist layer of the first region 201 is completed, the light-absorbing member 300 is disposed on the mask 200, such that the light-absorbing member 300 covers a portion of the first region 201, and the first diffusive reflection preventing part 316a is disposed at the border 203a of the first and second regions 201 and 202 (step S300). The light-absorbing member 300 covers a portion of the first region 201, and the first diffusive reflection preventing part 316a prevents a diffusive reflection of light being irradiated onto the photoresist layer.

The lamp 112 of the optical system 100 then generates light, which is adjusted to be appropriate for exposure, and irradiated onto the mask 200 (step S400).

Light passes through the second light transmission pattern 230 to arrive at the second region 202. The light also arrives at the border 203a of the first and second regions 201 and 202, however, the first diffusive reflection preventing part 316a prevents diffusive reflection.

The photoresist layer formed on the substrate 410 is exposed to form patterns for one of a key pattern for forming the TFT, a key pattern for forming the pixel electrode, a key pattern for forming the black matrix, a key pattern for forming the color filter pattern, etc.

Although the exposure method described above includes exposing the first region 201 before exposing the second region 202, it should be recognized that, alternatively, the second region 202 may be exposed before the first region 201 is exposed. The photoresist pattern is completed by repeating the exposure method above.

According to the present invention, the light-absorbing member 300 has the first and second diffusive reflection preventing parts 316a and 318a formed at the first and second side surfaces 316 and 318, respectively, preventing the diffusive reflection. The first and second diffusive reflection preventing parts 316a and 318a are surface-treated to the smooth surface that prevents the diffusive reflection that causes exposure defects.

Alternatively, the light-absorbing member 300 having the first and second diffusive reflection preventing members 316b and 318b includes material that absorbs light in order to prevent the diffusive reflection, thereby preventing exposure defects.

Having described the exemplary embodiments of the present invention and its advantages, it is noted that various changes, substitutions and alterations can be made herein without departing from the spirit and scope of the invention as defined by appended claims.

What is claimed is:

1. An exposure apparatus comprising:
   an optical system that generates light;
   a mask including a mask body disposed at a path of the light, a first light transmission pattern formed in a first region of the mask body, and a second light transmission pattern formed in a second region of the mask body, the second region being adjacent to the first region, the mask being transported in a first direction;
   a light-absorbing member disposed between the optical system and the mask, the light-absorbing member having a diffusive reflection preventing part formed at both side surfaces of the light-absorbing member, the both side surfaces being disposed at each border between the first and second regions; and
   a substrate plate that supports a substrate having a photoresist layer formed thereon, the substrate plate being transported along the first direction together with the mask.

2. The exposure apparatus of claim 1, wherein the diffusive reflection preventing part is disposed at a border between the first and second regions.

3. The exposure apparatus of claim 1, wherein the first light transmission pattern is disposed at a center portion of the mask, and the second light transmission pattern is disposed at opposite sides of the first light transmission pattern.

4. The exposure apparatus of claim 1, wherein the first light transmission pattern includes a pattern for forming image displaying elements of an apparatus, and the second light transmission pattern includes patterns for aligning the first light transmission pattern.

5. The exposure apparatus of claim 4, wherein the first region including the first light transmission pattern has an area larger than an area of the second region including the second light transmission pattern.

6. The exposure apparatus of claim 1, wherein the first and second light transmission patterns include first and second patterns, respectively, for forming image displaying elements of an apparatus.

7. The exposure apparatus of claim 6, wherein the first region including the first light transmission pattern has an area smaller than an area of the second region including the second light transmission pattern.

8. The exposure apparatus of claim 1, wherein the light-absorbing member has a rectangular plate shape, and the light-absorbing member is arranged in a second direction that is substantially perpendicular to the first direction.

9. The exposure apparatus of claim 1, wherein the diffusive reflection preventing part has a smooth surface to prevent diffusive reflection of the light.

10. The exposure apparatus of claim 1, wherein the light-absorbing member comprises a first light absorbing sub-member and a second light-absorbing sub-member spaced apart from the first light-absorbing sub-member.

11. The exposure apparatus of claim 10, further comprising an interval adjusting part that adjusts a distance between the first and second light-absorbing sub-members.

12. The exposure apparatus of claim 1, further comprising a mask supporter that supports the mask, wherein the mask supporter includes a first leveling unit that levels the mask, and the substrate plate includes a second leveling unit that levels the substrate.

13. The exposure apparatus of claim 12, further comprising a carrier combined with the mask supporter and the substrate plate to transport the mask supporter and the substrate plate along the first direction.

14. An exposure apparatus comprising:
   an optical system that generates light;
   a mask including a mask body disposed at a path of the light, a first light transmission pattern formed in a first region of the mask body, and a second light transmission pattern formed in a second region of the mask body, the second region being adjacent to the first region, the mask being transported in a first direction;
   a light-absorbing member disposed between the optical system and the mask, the light-absorbing member having a diffusive reflection preventing member attached to both side surfaces of the light-absorbing member, the both side surfaces being disposed at each border between the first and second regions; and a substrate plate that supports a substrate having a photoresist layer formed thereon, the substrate plate being transported along the first direction together with the mask.

15. The exposure apparatus of claim 14, wherein the diffusive reflection preventing member is disposed at a border between the first and second regions.

16. The exposure apparatus of claim 14, wherein the diffusive reflection preventing member comprises one of a smooth surface to prevent diffusive reflection of light, and a light absorbing material to prevent diffusive reflection of light.

17. A method of exposing a photoresist layer formed on a substrate by a mask having a first light transmission pattern formed in a first region of the mask and a second light transmission pattern formed in a second region of the mask, the second region being adjacent to the first region, comprising:

arranging a light-absorbing member in the second region to cover a portion of the second region such that a first diffusive reflection preventing part disposed at a first side surface of the light-absorbing member is disposed at a border between the first and second regions;

irradiating light onto the first region through the first light transmission pattern;

arranging the light-absorbing member in the first region to cover a portion of the first region such that a second diffusive reflection preventing part disposed at a second side surface of the light-absorbing member is disposed at the border between the first and second regions; and irradiating light onto the second region through the second light transmission pattern.

18. The method of claim 17, further comprising disposing smooth surfaces at the first and second diffusive reflection preventing parts to prevent a diffusive reflection of light.

19. The method of claim 17, wherein the arranging of the light-absorbing member includes disposing a first light-absorbing sub-member and a second light-absorbing sub-member spaced apart from each other.

20. The method of claim 17, further comprising transporting the mask and the substrate in a same direction.

* * * * *